(12) United States Patent
Ruque

(10) Patent No.: US 7,016,201 B1
(45) Date of Patent: Mar. 21, 2006

(54) DEVICE FOR PROTECTING A DRAWER ELECTROMAGNETICALLY

(75) Inventor: Christian Ruque, Corbas (FR)

(73) Assignee: Alstom, Paris (FR)

( * ) Notice: Subject to any disclaimer, the term of this patent is extended or adjusted under 35 U.S.C. 154(b) by 884 days.

(21) Appl. No.: 09/628,442

(22) Filed: Jul. 28, 2000

(30) Foreign Application Priority Data

Jul. 30, 1999 (FR) .................................. 99 10097

(51) Int. Cl.
*H05K 9/00* (2006.01)

(52) U.S. Cl. ........................ 361/818; 361/799; 361/816

(58) Field of Classification Search ................ 361/752, 361/753, 756, 759, 788, 796–802, 816, 818, 361/695; 174/35 R, 356 C; 312/223.2, 312/223.1; 211/26
See application file for complete search history.

(56) References Cited

U.S. PATENT DOCUMENTS

| | | | |
|---|---|---|---|
| 3,502,784 A | | 3/1970 | Kunkel |
| 5,187,648 A | * | 2/1993 | Ito ............................. 361/424 |
| 5,313,016 A | * | 5/1994 | Brusati et al. ............ 174/35 R |
| 5,467,254 A | * | 11/1995 | Brusati et al. .............. 361/799 |
| 5,594,627 A | * | 1/1997 | Le ............................... 361/801 |
| 5,808,866 A | * | 9/1998 | Porter ......................... 361/695 |
| 5,949,645 A | * | 9/1999 | Aziz et al. ................... 361/695 |
| 5,991,163 A | * | 11/1999 | Marconi et al. ............. 361/788 |
| 6,209,842 B1 | * | 4/2001 | Anderson et al. ........... 248/560 |

FOREIGN PATENT DOCUMENTS

DE 43 09 084 A1 9/1994

OTHER PUBLICATIONS

"Radio Frequency Interference Suppression Clip and Mechanical Guidance Aid" IBM Technical Disclosure Bulletin, US, IBM corp. New York, vol. 32, No. 8B, Jan. 1, 1990, pp. 264-265, XP000082476.

* cited by examiner

*Primary Examiner*—Kamand Cuneo
*Assistant Examiner*—Tuan Dinh
(74) *Attorney, Agent, or Firm*—Sughrue Mion, PLLC

(57) ABSTRACT

For a drawer, equipped with electronics cards and inserted into a drawer-receiving structure through an opening provided in the front face of the drawer-receiving structure, a device for electromagnetically protecting the cards is formed by the front face of the drawer, and by the side faces, the top face, the bottom face, and the back face of the drawer-receiving structure, the faces being electrically conductive.

11 Claims, 5 Drawing Sheets

DEVICE FOR PROTECTING A DRAWER ELECTROMAGNETICALLY

The invention relates to a device for electromagnetically protecting a drawer equipped with electronics cards.

BACKGROUND OF THE INVENTION

It is known that an electronics device can be protected against electromagnetic disturbances from the outside, and that any electromagnetic waves it emits can be confined in order to avoid disturbing adjacent devices. To solve the problems of electromagnetic compatibility, it is known that all six faces of a drawer can be shielded to isolate the volume inside them from the ambient atmosphere. That approach solves the problems related to electromagnetic disturbances but it gives rise to the following problems:
 a new range of drawers that incorporate shielding must be created;
 contact elements, e.g. spring elements, must be incorporated between the faces of the drawer so as to create electromagnetic continuity between said faces;
 the faces of the drawer must be specially treated to guarantee good electrical contact over time, even in a salty mist environment;
 the flow of air for cooling the electronics components contained in the drawer is disturbed because the shielded faces hinder the flow of air; and
 it is necessary to create a special system for fixing electronics cards in the drawer, which system makes it possible to put the cards in the drawer while taking account of the necessary functional clearance and while also providing electrical continuity between the cards, in particular on the front face of the drawer. Such a mechanical system is complex and is generally made up of a plurality of juxtaposed conductive parts between which electrical contact means such as springs are disposed, which means are of relatively high cost and do not offer guaranteed reliability. In addition, it is also necessary to mask any empty card locations in order to close the openings left in the front face.

It also known, from FR-A-2 743 977, that it is possible to use a drawer whose mother board is disposed in the vicinity of the front face, the various cards being disposed between said mother board and output connectors provided on the back of the drawer. Such a drawer is not treated for electromagnetic compatibility.

OBJECTS AND SUMMARY OF THE INVENTION

More particularly, an object of the invention is to remedy those drawbacks by proposing a novel electromagnetic protection device that is simpler, more reliable, and less costly than the devices of the state of the art, and that is compatible with a drawer of the unpluggable type.

To this end, the invention provides a device for electromagnetically protecting a drawer equipped with electronics cards and suitable for being inserted into a drawer-receiving structure through an opening provided in the front face of said structure, said device comprising six faces distributed around said cards, wherein one of said faces of said device is formed by the front face of said drawer, while the five other faces of said device are formed by the side faces, the top face, the bottom face, and the back face of said drawer-receiving structure, which faces are electrically conductive.

The invention thus makes is possible to create an electromagnetic isolation structure on the basis of an unpluggable drawer of which only the front face is treated for electromagnetic compatibility. The remainder of the electromagnetic protection is formed by the five faces of the drawer-receiving structure, such as a housing, this drawer-receiving structure usually already having side, top, bottom, and back faces, so that the invention does not require any major modifications to be made to said structure.

The electromagnetic protection function requires no action other than to insert the drawer into the drawer-receiving structure. Once the drawer is in place in the drawer-receiving structure, the six faces of the device define a closed volume, inside which the electronics cards of the drawer are disposed and which is isolated electromagnetically from the outside. The electronics drawer can be of a standard type, and in particular, it does not need to include a top cover or a bottom cover. It is possible for the back of the drawer to be provided with connection devices only, it not being necessary for any electromagnetic isolation to be formed on said back. In addition, the connectors used between the drawer and the drawer-receiving structure do not need to be shielded because they are located inside the volume defined by the six faces of the protection device. the drawer can thus be light in weight because it does not include any electromagnetic protection element on its side faces or on its top, bottom, and back faces. Dissipating the heat given off from the electronics components is not hindered by the top and bottom faces of the drawer, which faces would otherwise oppose the flow of air by natural convection.

In a first advantageous embodiment of the invention, the device further comprises resilient electrical connection means for providing electrical connection between the front face of the drawer and the drawer-receiving structure. These resilient means, which may be formed by electrically-conductive springs disposed on the edges of the opening provided in the front face of the structure, and/or on the drawer make it possible to provide electrical continuity between the front face of the drawer and the side faces, the top face, and the bottom face of the drawer-receiving structure.

In another particularly advantageous embodiment of the invention, at least one of said faces, namely said side faces, said top face, said bottom face and said back face is provided with openings for allowing air to flow through and/or for allowing electrical cables to pass through. This embodiment of the invention makes use of the fact that effective electromagnetic protection can be obtained by means of surfaces that are not necessarily uninterrupted, but rather that are provided with openings of sizes matched to the desired electromagnetic protection. In which case, it is possible, in the vicinity of its back face, for the drawer-receiving structure to be provided with connectors suitable for co-operating with connectors secured to the cards and provided on the drawer, and while the back face of said structure is a grating provided with openings for passing cables for connecting to the connectors of said structure. It is thus possible to power the connectors which are situated in the inside volume of the drawer-receiving structure through the back face, without disturbing the resulting electromagnetic protection function.

In addition, the top and bottom faces of the drawer-receiving structure may be formed by plates provided with air-flow openings, thereby facilitating cooling of the electronics components carried by the cards. In which case, the sum of the areas of the openings in each of said top and bottom faces is approximately equal to the area through which air can pass vertically in said drawer.

It is also possible to make provision for the maximum dimension of the openings to be considerably smaller than the minimum wavelength of the electromagnetic waves from which said drawer is to be isolated. Thus, there is no risk that the electromagnetic waves might propagate through the openings.

The invention is also applicable when the drawer-receiving structure is suitable for receiving a plurality of drawers. In which case, the drawer-receiving recesses for two adjacent drawers are separated by an intermediate electrically-conductive plate suitable for creating electromagnetic isolation between said recesses. It is also possible for said intermediate plate to be provided with openings for allowing air to flow through and/or for enabling electrical cables to pass through, and for it to carry resilient means for establishing electrical connection with the front faces of the drawers received in said two recesses.

BRIEF DESCRIPTION OF THE DRAWINGS

The invention will be better understood and other advantages of the invention will appear more clearly on reading the following description of two embodiments of an electromagnetic protection device complying with the principle of the invention, the description being given merely by way of example and with reference to the accompanying drawings, in which.

MORE DETAILED DESCRIPTION

Figure 1:
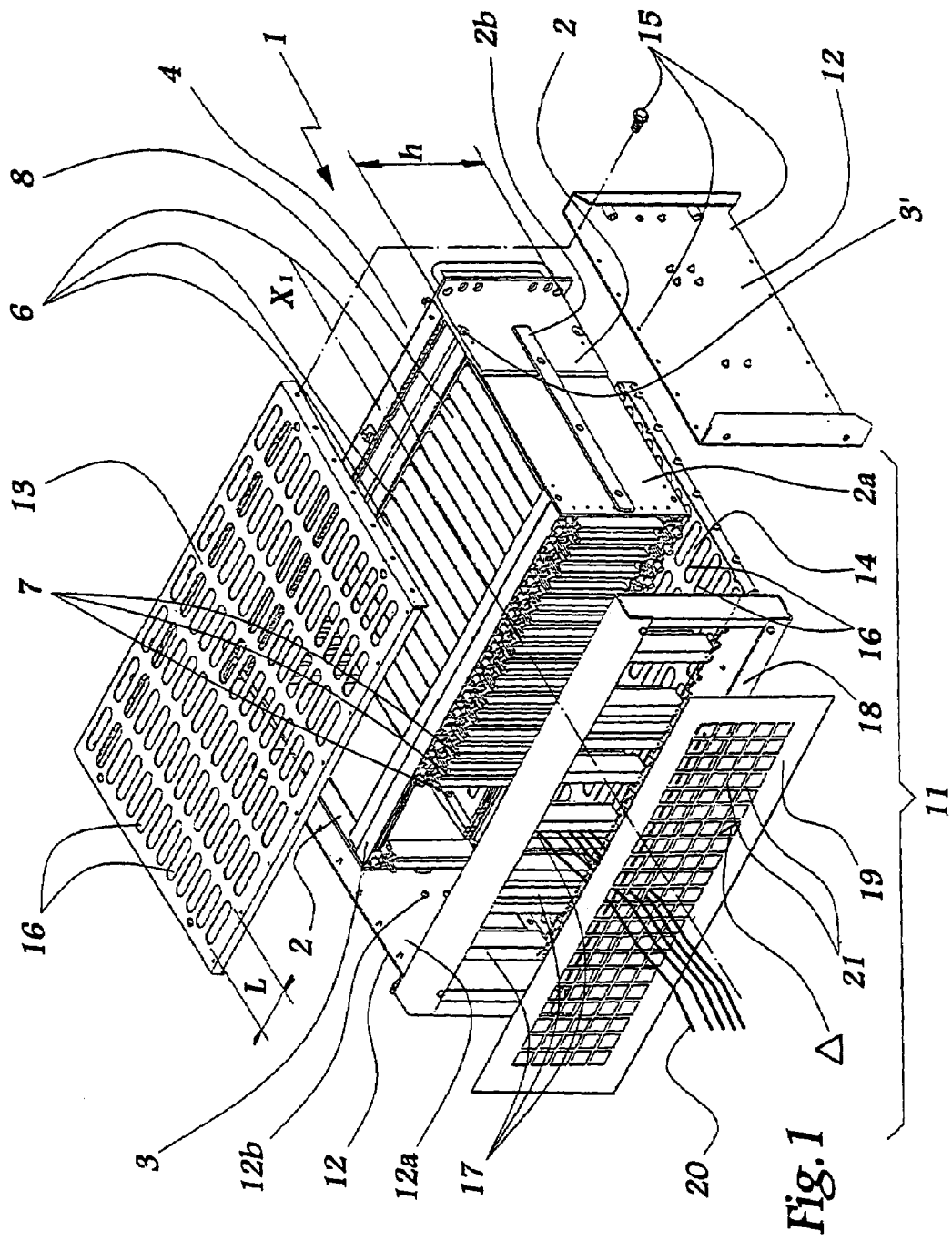
FIG. 1 is an exploded perspective view from the back of a first embodiment of a device of the invention.

The drawer 1 shown in FIGS. 1 to 4 is standardized and "unpluggable". It is as defined in the teaching of FR-A-2 743 977, and it is made up of two side plates 2 interconnected by four beams 3, two of which are disposed at the top of the drawer 1, and two of which are disposed at the bottom of the drawer. The elements 2 and 3, as assembled together by screws 3', make up the structure of the drawer 1.

The outside faces 2a of the side plates 2 carry runners 2b extending in a direction $X_1$ that is substantially horizontal. A front face 4 is provided on the drawer 1 on that end thereof which is to face an operator. The front face is fixed by screws to the side plates 2 and/or to the beams 3.

At the bottom, the front face 4 is provided with a flange 4a extending towards the nearest beam 3. The front face 4 can thus be fixed to the structure of the drawer 1 merely by means of the screws 5 shown in FIG. 3 and co-operating with the side plates 2, it being possible to omit the screws 5 shown in FIG. 2 and co-operating with the beams 3. This reduces the time required to mount the front face 4 on the drawer 1 and to remove it therefrom. Other modes of mounting the front face 4 on the drawer may be considered.

Electronics cards 6 are disposed in the drawer 1 parallel to the side plates 2 and between said side plates. On the end opposite from the front face 4, each of the cards is provided with a connector 7.

At the opposite end from the connector 7, each of the cards 6 is connected to a mother board 8 disposed parallel to the front face 4, in the vicinity thereof.

Figure 2:
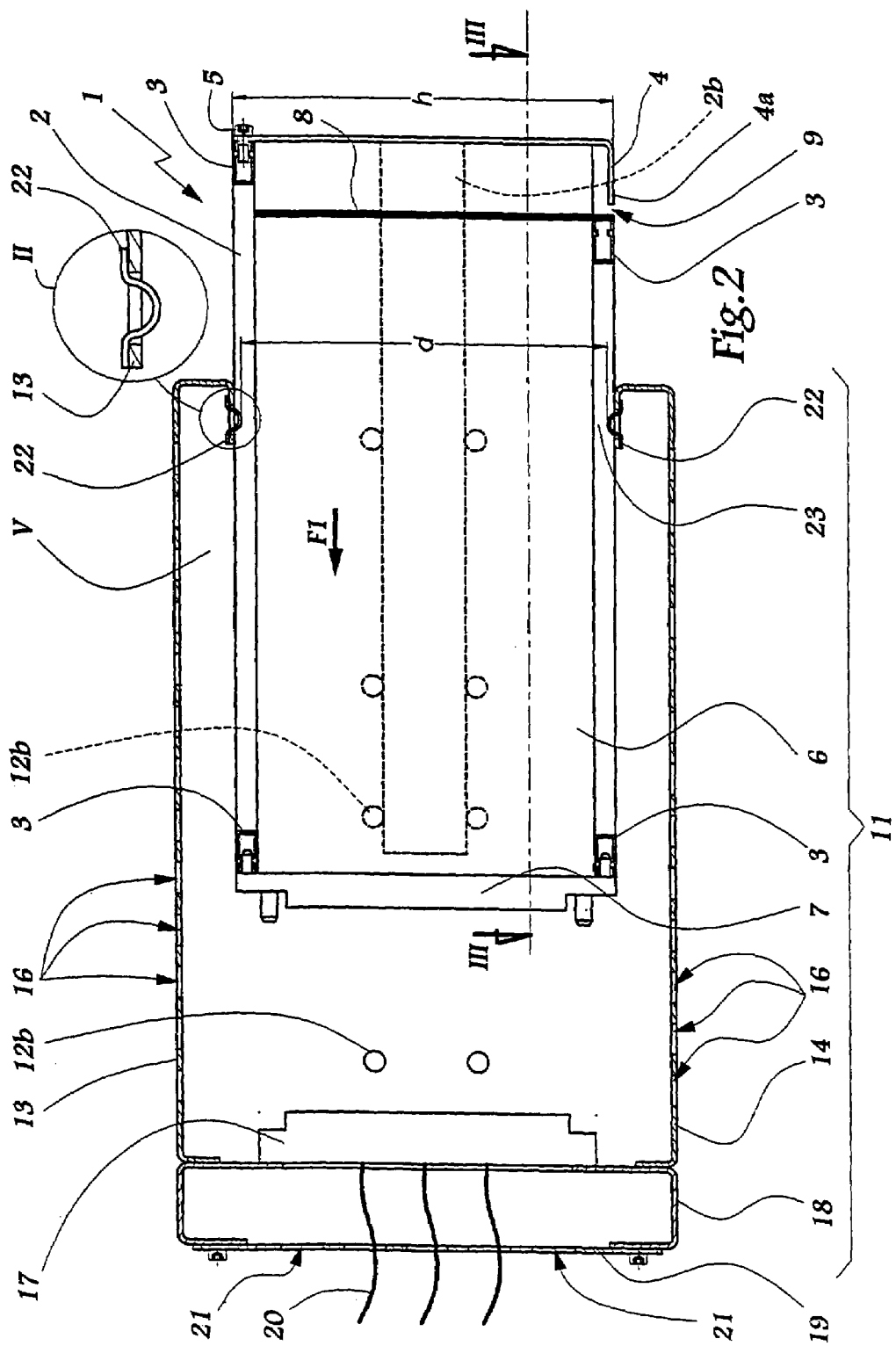
FIG. 2 is a vertical section view of the device of FIG. 1 while the drawer is being inserted into the structure for receiving it, a detail II being shown on a larger scale.
Figure 3:
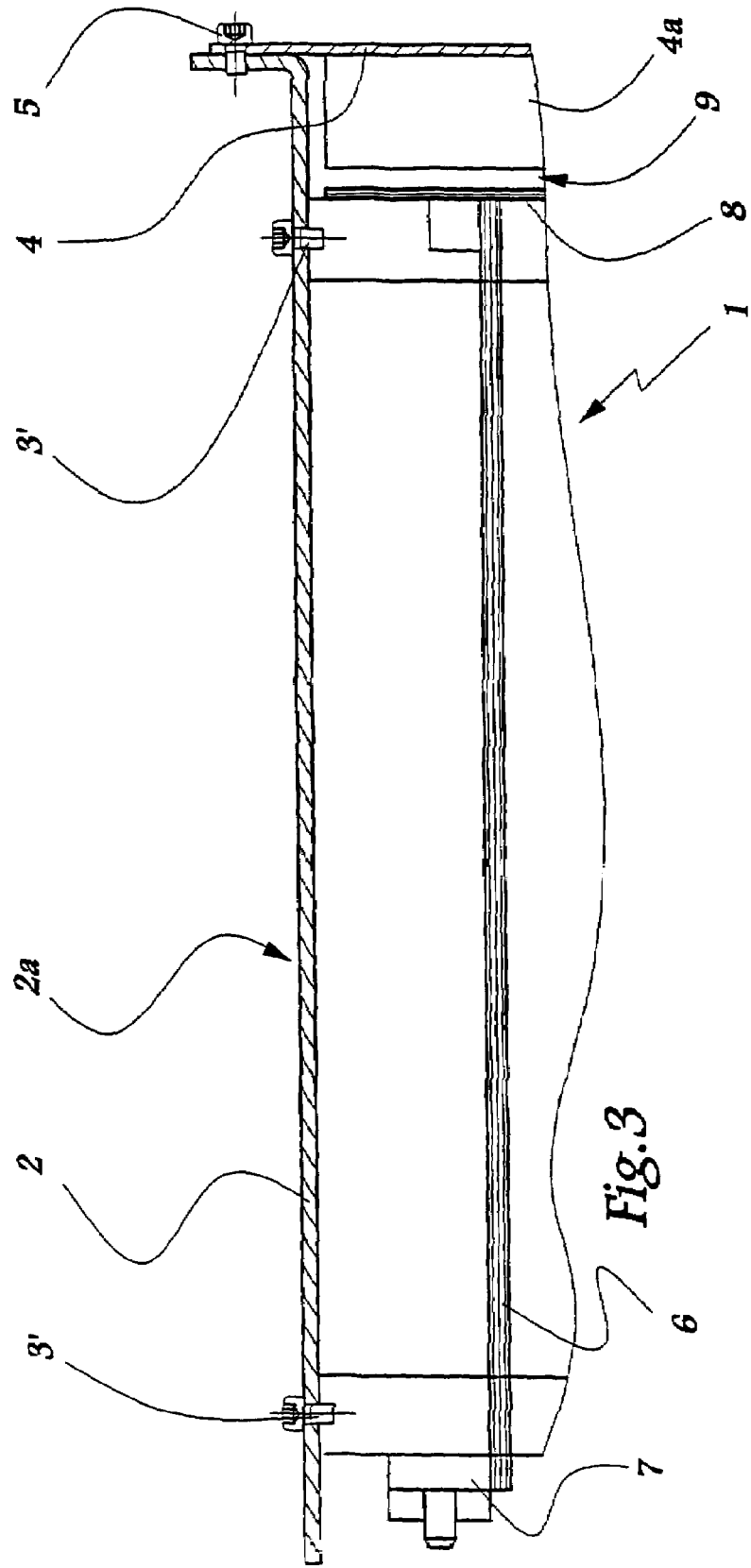
FIG. 3 is a fragmentary cross-section view of the drawer on line III—III in FIG. 2.

As shown both in FIG. 2 and in FIG. 3, the mode of fixing the front face 4 to the beams 3 of the drawer 1 and to the side plates 2 makes it possible to create electrical continuity between firstly said front face, which is uninterrupted or perforated depending on the electromagnetic compatibility needs, and secondly the beams 3 and the side plates 2. However, there remains a gap 9 which can be a site of "electromagnetic leakage" at the bottom of the drawer between the flange 4a and the nearest beam 3.

The drawer-receiving structure includes two uninterrupted side plates 12 whose inside faces 12a are provided with studs 12b organized to co-operate with the runners 2b of the drawer 1 to guide the drawer 1 in translation in the structure 11 in a direction $X_1$. A top plate 13 and a bottom plate 14 are held under tension between the side plates 12 by being secured respectively to the tops edges and to the bottom edges of said side plates by means of screws 15. The plates 13 and 14 are perforated with oblong holes 16 distributed over their surfaces.

The maximum dimension, i.e. the length L, of the holes 16 is chosen such that it satisfies the following relationship:

$$L \ll \lambda = c/f$$

where $\lambda$ is the minimum wavelength of the electromagnetic waves whose propagation is to be prevented going towards the drawer 1 or away therefrom;

c is the speed of light; and f is the frequency of the waves.

The total area of the holes 16 in each of the plates 13 and 14 is approximately equal to the area through which air passes vertically in the drawer 1, i.e. to that space between the horizontal beams 3 and the plates 2 which is not occupied by the electronics cards 6 and 8.

In its back portion, the drawer-receiving structure 11 is provided with connectors 17 mounted on a support 18, which connectors 17 are provided to co-operate with the connectors 7 of the drawer 1 by being unpluggable therefrom. A grating 19 is disposed parallel to the support 18 and it makes it possible to close the back of the volume defined between the side plates 12 and by the plates 13 and 14. In this sense, the grating 19 constitutes the back face of the drawer-receiving structure 11.

The elements 12, 13, 14, 18, and 19 are electrically conductive, and as a result of being assembled together, are electrically connected together.

The connectors 17 are connected to the environment of the structure 11 via conductor cables 20 which pass through the grating 19 by going through the openings 21 in the grating. In the example shown, these openings are substantially square and their diagonal is referenced $\Delta$. As above, the diagonal $\Delta$ is related to the wavelength $\lambda$ of the surrounding electromagnetic waves by the following relationship:

$$\Delta \ll \lambda = c/f$$

At the front end, i.e. opposite from the elements 17 to 21, the structure 11 is provided with resilient springs 22 disposed at the top and bottom portions of an opening 23 through which the drawer 1 can be inserted into the structure 11 by causing the rails 2b to co-operate with the studs 12b, the insertion direction being shown by the arrow $F_1$ in FIG. 2.

In a first variant of the invention (not shown), the springs 22 may be mounted on the drawer 1. In a second variant (not shown either), the springs may be disposed in alternation on the structure 11, e.g. on the bottom portion, and on the drawer, e.g. on the top portion, or vice versa.

Figure 4:
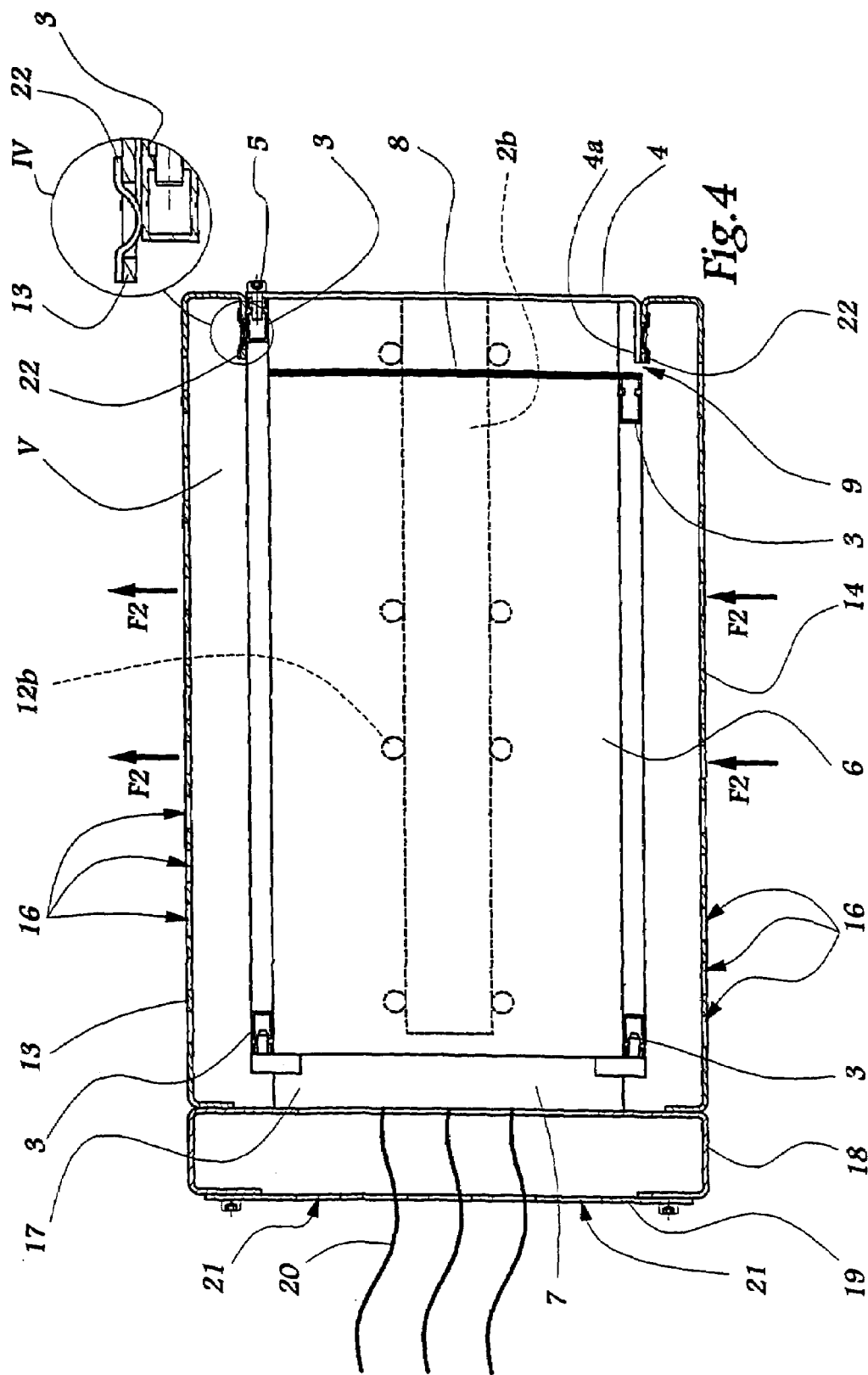
FIG. 4 is a section view analogous to FIG. 3, with the drawer being shown in the position in which it is connected to the drawer-receiving structure, a detail IV being shown on a larger scale.

As shown in FIG. 4, and in particular in the detail IV, when the drawer 1 is in place in the structure 11, its front face 4 is in abutment against the springs 22 on the bottom portion, and the nearest beam 3 is in abutment against the springs 22 on the top portion. Thus, electrical continuity is formed between said front face 4 and the structure 11 as a whole, and in particular the side plate 12 and the plates 13 and 14.

In this position, the connectors 7 and 17 are plugged together, and the cards 6 are connected to their environment via the cables 20. The cards 6 then lie within a closed volume V defined by the front face 4, by the side plates 12, by the plates 13 and 14, and by the grating 19, electrical continuity being provided between the various surfaces such that the volume V is electromagnetically isolated, some of the openings 16 and 21 provided in some of these surfaces making it possible for cooling air to flow through, as indicated by arrows $F_2$ in FIG. 4 and, the other openings provided in some of the surfaces enabling the cards 6 to be electrically connected by means of the cables 20.

In particular, the above-mentioned gap 9 lies within the volume V so that any electromagnetic leakage through it remains confined within said volume.

In order to guarantee effective electrical contact between the drawer 1 and the springs 22, provision is made for the height h of the drawer 1 to be greater than the distance d between the springs 22 when they do not interfere with the drawer 1. This makes it possible to compress the springs 22 and guarantees effective electrical contact between the springs and the drawer 1, at a beam 3 or at the front face 4.

In variants of the invention (not shown), the cables 20 may penetrate into the volume V via any surface of the drawer-receiving structure 11, in particular via one of the plates 13 or 14. In another variant embodiment of the invention, the side plates 12 may be provided with openings through which conductor cables can pass, or through which air can flow.

Figure 5:
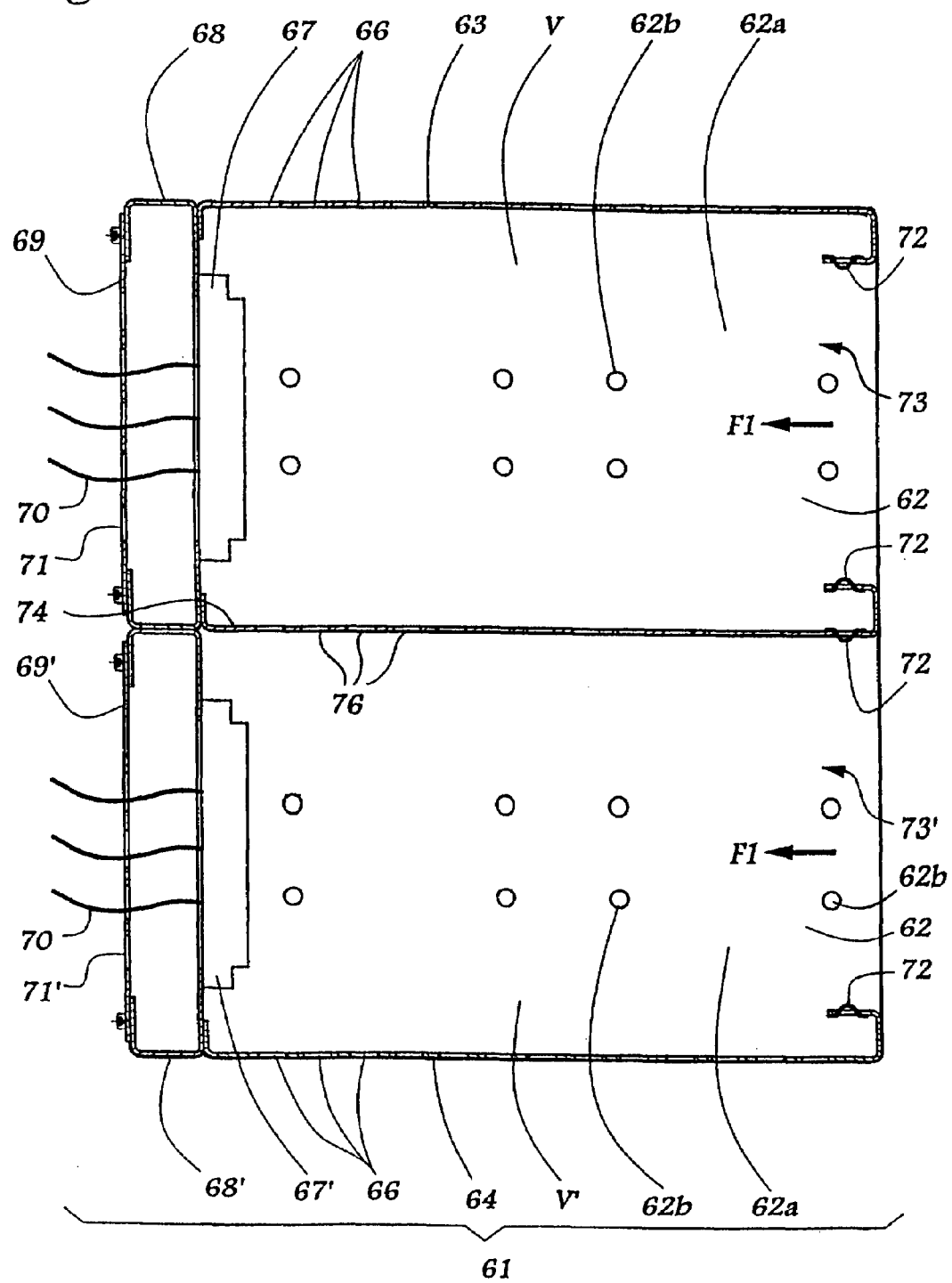
FIG. 5 is a vertical section view of a drawer-receiving structure in a second embodiment of the invention.

In the second embodiment of the invention shown in FIG. 5, elements analogous to the elements of the first embodiment are given identical references plus 50. The drawer-receiving structure 61 of this embodiment defines two volumes V and V' for receiving drawers (not shown) and includes side plates 62 whose inside faces 62a are provided with studs 62b, while a top plate 63 and a bottom plate 64 are connected to the side plates 62 by any suitable means, e.g. by screws. Each of the plates 63 and 64 is provided with a hole 66 through which cooling air can pass.

Connectors 67 and 67' are mounted on supports 68 and 68' while two gratings 69 and 69' are provided at the back of the structure 61 between the plates 63 and 64. Conductor cables 70 are provided for powering the connectors 67 through the openings 71 and 71' in the gratings 69 and 69'.

Springs 72 are provided on the bottom and top portions of each opening 73 and 73' via which drawers analogous to the drawer 1 of the first embodiment can be inserted, as indicated by arrows $F_1$.

An intermediate plate 74 is disposed between the volumes V and V' and is provided with holes 76 distributed analogously to the distribution of the holes 66 in the plates 63 and 64. As above, the total area of the holes 66 of each of the plates 63 and 64 and of the holes 76 in the plate 74 is substantially equal to the area through which air can pass vertically in a drawer organized to be mounted inside the volumes V and V'.

The plate 74 carries two rows of springs 72 organized to connect it electrically respectively to the bottom portion of the front face of a drawer received in the volume V, and to the front top beam of a drawer received in the volume V'.

The resulting drawer-receiving structure 61 makes it possible to receive two electronics drawers, each drawer being protected as regards electromagnetic compatibility from the outside and also from the adjacent drawer, while the structure 61 is simple to manufacture. It is possible to simplify the structure 61 further by making provision for the side plates 62 on either side of the two drawers, and/or the gratings 69 and 69' to be made in one piece.

Naturally, a structure suitable for receiving three or more drawers may be provided on the basis of the embodiment shown in FIG. 5.

The invention claimed is:

1. A device for electromagnetically protecting a drawer equipped with electronics cards, said drawer for being inserted into a drawer-receiving structure through an opening provided in a front face of said drawer-receiving structure, said device comprising six faces distributed around said cards, wherein one of said faces of said device is formed by a front face of said drawer, while the five other faces of said device are formed by two side faces, a top face, a bottom face, and a back face of said drawer-receiving structure, said faces being electrically conductive.

2. A device according to claim 1, further comprising resilient electrical connection means for providing electrical connection between said front face of said drawer and said drawer-receiving structure.

3. A device according to claim 1, wherein at least one of said faces is provided with openings for at least one of allowing air to flow through and allowing electrical cables to pass through.

4. A device according to claim 1, wherein said structure is suitable for receiving a plurality of drawers, wherein drawer-receiving recesses for two adjacent drawers are separated by an intermediate electrically-conductive plate suitable for creating electromagnetic isolation between said two recesses.

5. A device according to claim 1, wherein a plurality of said faces are provided with openings for at least one of allowing air to flow through and allowing electrical cables to pass through.

6. A device according to claim 2, wherein said resilient electrical connection means are formed by electrically-conductive springs disposed on edges of said opening provided in the front face of the structure, and/or on said drawer.

7. A device according to claim 3, wherein, in the vicinity of said back face, said drawer-receiving structure is provided with connectors suitable for cooperating with connectors secured to said cards, and wherein said back face is a grating provided with openings for passing cables for connecting to said connectors of said structure.

8. A device according to claim 3, wherein said top and bottom faces are formed by plates provided with air-flow openings.

9. A device according to claim 3, wherein a maximum linear dimension of said openings is considerably smaller than a minimum wavelength of electromagnetic waves from which said drawer is to be isolated.

10. A device according to claim 4, wherein said intermediate plate is provided with openings for allowing air to flow through and/or for enabling electrical cables to pass through, and wherein said intermediate plate carries resilient means for establishing electrical connection with the front faces of drawers received in said two recesses.

11. A device according to claim 8, wherein the sum of the areas of the openings in each of said top and bottom faces is approximately equal to the area through which air can pass vertically in said drawer.

* * * * *